United States Patent [19]
Gabuzda

[11] Patent Number: 4,733,293
[45] Date of Patent: Mar. 22, 1988

[54] HEAT SINK DEVICE ASSEMBLY FOR ENCUMBERED IC PACKAGE

[75] Inventor: Paul G. Gabuzda, Laguna Beach, Calif.

[73] Assignee: Unisys Corporation, Detroit, Mich.

[21] Appl. No.: 14,575

[22] Filed: Feb. 13, 1987

[51] Int. Cl.⁴ .............................................. H05K 7/20
[52] U.S. Cl. ................. 357/81; 174/16 HS; 165/80.3; 165/185; 361/383
[58] Field of Search ................ 357/81; 165/80.3, 80.4, 165/185; 174/16 HS; 361/383

[56] References Cited
U.S. PATENT DOCUMENTS
3,313,339 4/1967 Coe ........................................ 165/80
4,587,595 5/1986 Staples ................................ 361/388
4,682,651 7/1987 Gabuzda ........................... 357/81 X OTHER PUBLICATIONS
Aham catalog, Heat Sinks Coolers, published by Aham of Rancho, Calif., Jun. 1, 1977, p. 13.

Primary Examiner—R. R. Kucia
Attorney, Agent, or Firm—Alfred W. Kozak; Nathan Cass; L. Joseph Marhoefer

[57] ABSTRACT

A heat sink device assembly providing a radially finned heat sink with a tapered base is provided for application to surface-encumbered integrated circuit packages for heat dissipation purposes. The device involves a patterned set of radial fin elements, through which cooling air flow may pass, mounted on a baseplate. A taper or reduction in cross sectional area of the baseplate is provided in order to maximize the surface area for heat dissipation while constraining the area of attachment, thus avoiding physical or electrical contact with peripheral objects or areas placed on the surface edges of the integrated circuit package.

9 Claims, 3 Drawing Figures

HEAT SINK DEVICE ASSEMBLY FOR ENCUMBERED IC PACKAGE

FIELD OF THE INVENTION

This disclosure relates to specialized heat sink and assembly units for the cooling of integrated circuit package components.

CROSS REFERENCE TO RELATED APPLICATIONS

This application is related to a copending application entitled "Staggered Radial-Fin Heat Sink Device For Integrated Circuit Package" by inventors Paul G. Gabuzda and S. Victor Terrell, filed in the U.S. Patent Office on June 30, 1986 as U.S. Ser. No. 880,427. A notice of allowance was issued on Sept. 24, 1987.

This application is also related to a copending application entitled "Reduced-Stress Heat Sink Device" filed July 18, 1986 as U.S. Ser. No. 886,994 by inventor Paul G. Gabuzda.

Also related is U.S. Ser. No. 904,442 which issued as U.S. Pat. No. 4,682,651 on July 28, 1987 and was entitled "Segmented Heat Sink Device" by inventor Paul G. Gabuzda.

BACKGROUND OF THE INVENTION

In modern day digital equipment, there has been developing a greater and greater density of packaging on printed circuit boards, and a higher density of printed circuit boards in computer and digital cabinetry, with larger and more complex integrated circuit package components. In this situation, there have been numerous ways developed to reduce the generation of internal heat and to carry away the excessive heat buildup.

One of the basic ways of doing this has been to develop metallic fins and other heat conducting means by which cooling air can be used to carry away the accumulated internal heat within the integrated circuit packages that are used on the printed circuit boards.

A major problem has been to provide for the maximization of the heat dissipation and at the same time to be economically feasible, while additionally providing for ease of application to areas which are restricted in space and cooling capacity. These problems further require ease of attachment for a maximum of heat dissipation to integrated circuit packages having a limited area or encumbered area of heat sink attachment.

Thus, in order to provide an economically feasible heat dissipation from small compact areas or from areas encumbered or limited because of electrical or mechanical requirements, there has been developed a heat sink device for attachment to the top of an integrated circuit package comprised of cooling fins mounted on a spreader plate, but with a reduction of area at the base of the spreader plate, the radial metallic fins being configured to form a central orifice area whereby cooling air can impinge into the orifice area and outwardly pass by the fins to provide the required cooling action.

Very often the surfaces of integrated circuit packages use perimeter areas around the top edges to provide space for electrical test points and electronic components. Thus special types of heat sink mountings may be required to accommodate these conditions. By including a reducing taper in the spreader plate of the heat sink device, the dissipating fins comprise a much larger surface area, and thus a more effective heat transfer, than would otherwise be possible on an integrated circuit package with an encumbered or limited area of heat sink attachment.

SUMMARY OF THE INVENTION

The present disclosure involves an assembly of a metallic heat sink co-joined with an integrated circuit package having peripheral edge areas encumbered by test points and/or electronic components.

The metallic finned heat sink includes a pattern of radially oriented variable length metallic fins mounted on a spreader plate of area greater than the available contact area on the surface of the integrated circuit package, but whereby the contact area of the spreader plate is tapered inwardly to reduce the area-size of the adhesive contact area between the heat sink and the surface of the integrated circuit.

This arrangement avoids entanglement with the integrated circuit's peripheral edges which carry electronic components and/or electrical contact points yet still permits a wider spread plate for longer lengthed finned areas on the heat sink.

DESCRIPTON OF PREFERRED EMBODIMENT

Figure 1:
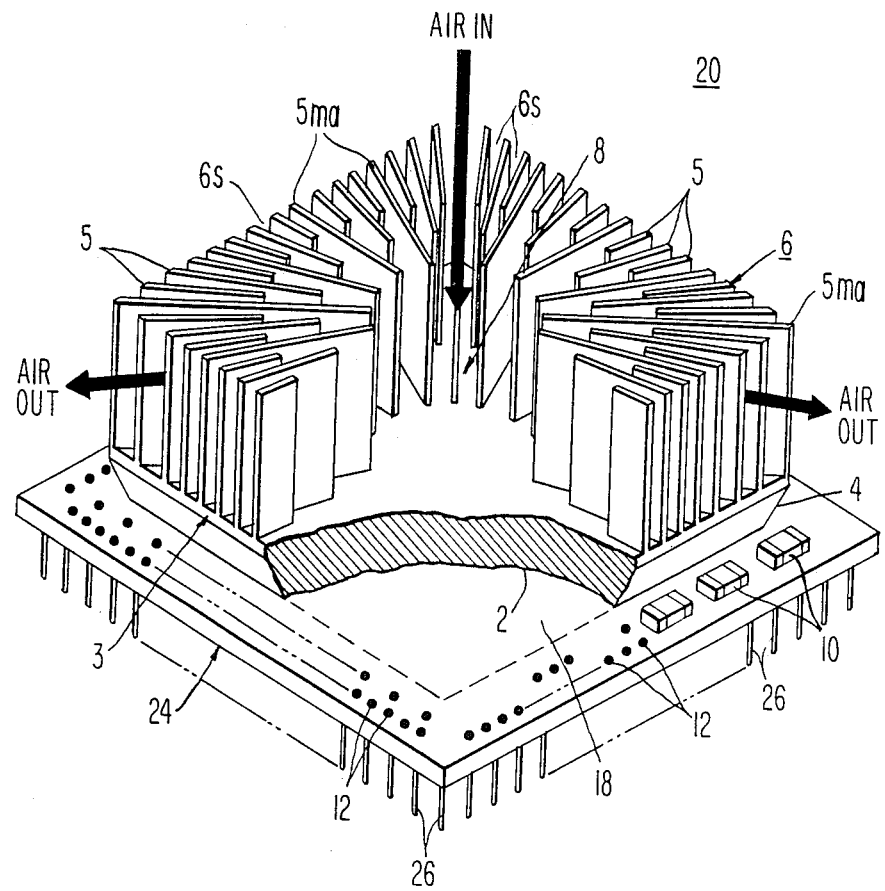
FIG. 1 is a drawing of the heat sink assembly with a perspective, cutaway view of the tapered heat sink device, shown attached to an integrated circuit package with a constrained heat dissipative surface.

Referring to FIG. 1, there is seen an integrated circuit pin-grid array package 24 having underside pins 26, electrical test points 12, and surface-mounted decoupling capacitors 10. An adhesive contact area 18 is provided on top of the integrated circuit package for the attachment of the heat sink device 20 with its tapered base 4.

Figure 2:
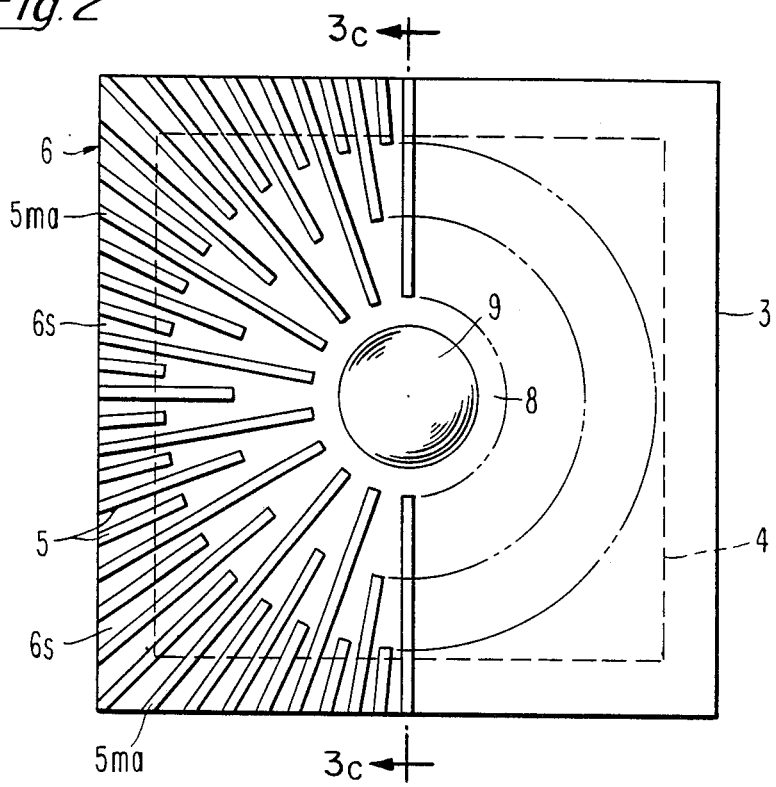
FIG. 2 is a top plan view of the tapered heat sink device.

As will be seen in FIG. 1 and FIG. 2, the heat sink assembly 20 is comprised of a plurality of fins 5 of varying length, radially oriented and mounted on a spreader plate 3, which includes a tapered reduction in area 4 to provide an acceptably small area of contact 2 with the top 18 of the integrated circuit package 24.

It will be seen that the metallic heat dissipating fins 5 follow a specific pattern for providing a maximum of cooling area to the air flow, with the major-length fins 5ma being terminated in such a way as to provide a circular opening 8 into which the impinging cool air is pushed so that it may then be directed past the various lengthed fins, with the greatest number of fins and thus the greatest proportion of heat transfer area being located at the outermost portion of the heat sink 6. A hemispherical aerodynamic hub 9 (FIG. 2) is located at the center of the circular opening 8 to aid in the diffusion and distribution of the impinging air.

Referring to FIG. 2, it will be seen that the fins 5 have a design pattern of a long fin, a short fin, a medium length fin, and a long fin (5ma), whereupon the pattern repeats. This forms a highly efficient and large sized cooling surface area. Formed by the inner circumference of the major length fins, 5ma, is the open central area 8, at the center of which is the hemispherical aerodynamic hub 9, helpful for smooth dispersion of impinging air, but not necessarily an essential component for adequate operation.

The area of element 3 indicates the base area of heat sink 6 which is tapered at area 4 to provide the reduced size adhesive contact area 2.

It will be observed that because of the unique design of the radial fin heat sink device 6, even a small increase in the breadth of the spreader plate 3 and the fins 5 will result in a sizable augmentation of the surface area available for heat transfer, resulting in a more efficient removal of heat than would be otherwise possible in a constrained area of heat dissipation 18. This results in a much greater surface area at spreader plate 3 than would be possible at the constrained area 18.

Referring again to FIG. 1, the heat sink assembly 20 is specifically designed to avoid, under any circumstances, physical or electrical contact with the integrated circuit electrical test points 12 or the decoupling capacitors 10, thus allowing for any positioning tolerances of the heat sink 6 relative to the integrated circuit package 24, as well as for any fillet of adhesive that may arise at the periphery of the area of attachment 18.

Figure 3C:
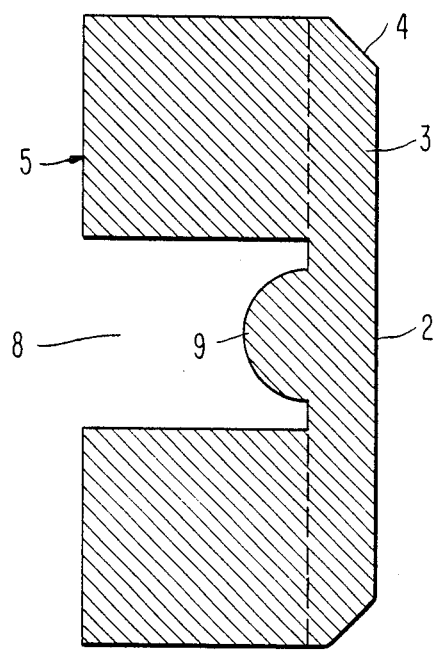
FIG. 3 is a cross-sectional view of FIG. 2 as indicated by the cutout line in FIG. 2 designated as $3_c$—$3_c$.

FIG. 3 indicates a cross-sectional view of the cutout lines $3_c$—$3_c$ shown in FIG. 2. As seen in FIG. 3, the tapered base 4 has a contact area 2 which is formed by the spreader plate 3. The long fins 5ma are truncated in order to form the central cylindrical open orifice area 8 through which pressurized impinging airflow may be directed to impinge upon the hemispheric domed area or hub 9, which causes a uniform and circular dispersion of air past and through the radial fin elements 5. The radial fins touch and cover a substantial portion (up to 50%) of the baseplate 3 in addition to being lined up next to each other with small spatial intervals between, in order to present a very large surface area to the by-passing cooling air. Additionally, the staggered fin-length arrangement of long-short-medium-short which occurs in a repetitive pattern operates to minimize the back pressure to the inflowing air and also enables a much quieter air passage to occur to minimize noise during airflow operation.

The fin elements 5 of FIG. 2 are seen to each be of the same width as are the spatial interstices $6_s$ which are also of approximately the same width as the fin elements 5.

While the drawings have indicated a "square" baseplate for the preferred embodiment, other forms may be used such as a circular baseplate having an upper level of larger cross section area and a lower level of smaller cross section area which attaches adhesively to the surface of the integrated circuit package but which avoids contact or overlap to the encumbered peripheral edges of the integrated circuit.

There has been described herein, a heat sink device assembly for integrated circuit packages comprised of radially mounted cooling fins on a spreader plate with a tapered base. The taper results in a reduction of area, such that the area of attachment to the integrated circuit package is constrained to avoid physical or electrical contact with proximal objects or zones, such as integrated circuit electrical test points or decoupling capacitors. Because of the propinquity of these objects or obstructions, and because of the large number of fins located along the periphery of the heat sink spreader plate, this arrangement permits a much greater surface area for heat transfer, and thus a significantly lower integrated circuit temperature, than would otherwise be possible.

While the above described heat sink device assembly with tapered base has been delineated in its preferred embodiment, there may be other variations of this assembly which fall within the concept as defined by the following claims.

What is claimed is:

1. An integrated circuit cooling assembly comprising, in combination:
   (a) an integrated circuit package having underside connecting pins and an upper surface area which is encumbered along the peripheral edges by electrical contacts and components, said upper surface area including:
      (a1) a non-encumbered surface area for adhesive attachment of a heat sink unit;
   (b) said heat sink unit for mounting on said non-encumbered surface area and including:
      (b1) a spreader baseplate for supporting a plurality of metallic fins radially oriented from the center of said baseplate, said baseplate including:
         (b1a) a tapered portion having an upper and lower plane whereby said upper plane supports said metallic fins on a larger base area than said lower plane which makes adhesive contact to said non-encumbered surface area;
         (b1b) said plurality of radially oriented fins residing perpendicularly to said baseplate and being of equal widths and arranged with space gaps therebetween having a width approximately equal to the width of each of said fins, said fins being repetitively patterned in lengths of long-short-medium-short;
         (b1c) a central cylindrical orifice opening enabling alignment with an impinging air flow directed perpendicularly toward said central opening of said baseplate upper plane, said central opening being formed by the inner edges of said long length fins.

2. The cooling assembly of claim 1 wherein said non-encumbered surface area constitutes a square or a rectangular configuration.

3. The cooling assembly of claim 1 wherein said non-encumbered surface area constitutes a circular configuration.

4. The cooling assembly of claim 1 wherein said radially oriented metallic fins are truncated in length near the center of said baseplate to form said central opening as an input channel for said impinging air flow.

5. The cooling assembly of claim 4 wherein said central opening includes a hemispheric dome mounted on the center of said spreader baseplate.

6. The cooling assembly of claim 4 wherein said metallic fins, which are formulated in a repetitive pattern of varying lengths of "long-short-medium-short", to maximize cooling surfaces without substantially damming the incoming air flow.

7. The cooling assembly of claim 1 wherein said heat sink unit spreader baseplate has a circular configuration with the diameter of said lower plane being sufficiently reduced to avoid said encumbered peripheral edges.

8. A heat sink device assembly having a central cylindrical opening for alignment with an impinging air flow which flows perpendicularly onto the upper plane of a baseplate of said assembly, the combination comprising:
   (a) an integrated circuit package having underside connecting pins and an upper surface area which is encumbered along the peripheral edges by electrical contacts and components, said upper surface area including:
(a1) a non-encumbered surface area for adhesive attachment of a heat sink unit;
(b) said heat sink unit mounted on said non-encumbered surface area and including:
(b1) said baseplate for supporting a plurality of vertical metallic fin elements radially oriented from the center of said baseplate, said baseplate including:
(b1a) a tapered portion having said upper plane and a lower plane whereby said upper plane supports said metallic fin elements on a larger base area than said lower plane which makes adhesive contact to said non-encumbered surface area;
(b2) said plurality of metallic fin elements equally spaced with air space interstices around the periphery of said baseplate wherein said fin elements constitute a pattern of long, intermediate, and short lengths oriented in the radial direction to form a repetitive sector pattern wherein said repetitive sector pattern includes:
(b2a) a sequence of said radial fin element lengths which follow the pattern of long-short-intermediate-short, which pattern repeats through each sector of the periphery of said heat sink unit; and wherein
(b2b) the width of each of said plurality of fin elements is of the same dimension, and
(b2c) the width of each of the said air space interstices between adjacent fin elements is substantially the same as the width of each of said fin elements;
(b3) said cylindrical opening situated at the central area of said upper plane of said baseplate to permit the perpendicular impingement of said air flow onto said baseplate.

9. The assembly of claim 8 wherein the said upper plane of said baseplate further includes:
(a) a hemispherical dome at the center of said upper plane for the purpose of receiving and evenly dispersing said impinging air flow through the said air space interstices between said fin elements.

* * * * *